US010969452B2

United States Patent
Nitta et al.

(10) Patent No.: US 10,969,452 B2
(45) Date of Patent: Apr. 6, 2021

(54) MAGNETIC RESONANCE IMAGING APPARATUS AND MULTI-SLICE IMAGING METHOD

(71) Applicant: Canon Medical Systems Corporation, Otawara (JP)

(72) Inventors: Shuhei Nitta, Tokyo (JP); Nobuyasu Ichinose, Otawara (JP); Hiroshi Takai, Nasushiobara (JP); Naho Imamura, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 16/391,384

(22) Filed: Apr. 23, 2019

(65) Prior Publication Data

US 2019/0346521 A1 Nov. 14, 2019

(30) Foreign Application Priority Data

May 11, 2018 (JP) .............................. JP2018-092507

(51) Int. Cl.
*G01R 33/483* (2006.01)
*G01R 33/54* (2006.01)

(52) U.S. Cl.
CPC ..... *G01R 33/4835* (2013.01); *G01R 33/4838* (2013.01); *G01R 33/543* (2013.01)

(58) Field of Classification Search
USPC ........................................................ 324/309
See application file for complete search history.

(56) References Cited

U.S. PATENT DOCUMENTS

| 6,023,634 A * | 2/2000 | Hanawa | G01R 33/54 324/307 |
| 6,850,793 B1 * | 2/2005 | Miyazaki | G01R 33/54 324/307 |
| 2009/0245607 A1* | 10/2009 | Sugiura | G01R 33/4818 382/131 |

FOREIGN PATENT DOCUMENTS

JP        7-327960        12/1995

* cited by examiner

*Primary Examiner* — Rodney E Fuller
(74) *Attorney, Agent, or Firm* — Oblon, McClelland, Maier & Neustadt, L.L.P.

(57) ABSTRACT

An MRI apparatus includes imaging control circuitry that performs shimming imaging for collecting a first MR signal, and multi-slice imaging for collecting a second MR signal along with radiation of a non-region-selective prepulse, and processing circuitry that generates static magnetic field distributions of the slices, determines a first center frequency of an RF pulse corresponding to each slice and a second center frequency of the prepulse based on the static magnetic field distribution, and determines an order of slices for collecting the second MR signal in accordance with the first and/or second center frequencies, wherein the imaging control circuitry performs the multi-slice imaging in accordance with the order and the first and second center frequencies.

14 Claims, 3 Drawing Sheets

MAGNETIC RESONANCE IMAGING APPARATUS AND MULTI-SLICE IMAGING METHOD

CROSS-REFERENCE TO RELATED APPLICATIONS

This application is based upon and claims the benefit of priority from the prior Japanese Patent Application No. 2018-092507, filed May 11, 2018, the entire contents of which are incorporated herein by reference.

FIELD

Embodiments described herein relate generally to a magnetic resonance imaging apparatus and a multi-slice imaging method.

BACKGROUND

A technique relating to a magnetic resonance imaging (MRI) apparatus that performs shimming on a static magnetic field based on a static magnetic field distribution (hereinafter referred to as "static magnetic field shimming"), is already known. For example, an MRI apparatus optimizes a center frequency of a prepulse, and a center frequency of a radio frequency (RF) pulse for each slice, by performing static magnetic field shimming during multi-slice imaging that involves radiation of prepulses for fat-suppression. In the multi-slice imaging, however, a prepulse radiated during the collection of MR signals at one stage may affect MR signals collected at a future stage, depending on the collection order of slices in which the MR signals are collected. Such an influence of prepulse may degrade image quality.

DETAILED DESCRIPTION

According to one embodiment, a magnetic resonance imaging apparatus includes imaging control circuitry and processing circuitry.

The imaging control circuitry performs shimming imaging for collecting first magnetic resonance signals used in static magnetic field shimming in a first collection range, and multi-slice imaging for collecting second magnetic resonance signals to each of a plurality of slices in a second collection range which overlaps at least a part of the first collection range. It also performs radiation of a non-region-selective prepulse corresponding to each of the slices.

The processing circuitry generates a plurality of static magnetic field distributions respectively corresponding to the slices based on the first magnetic resonance signal, determines a first center of an RF pulse corresponding to each of the slices and a second center frequency of the prepulse based on the static magnetic field distribution, and determines a collection order of slices in which the second magnetic resonance signals are collected in the multi-slice imaging, in accordance with at least one of the first center frequency and the second center frequency.

The imaging control circuitry performs the multi-slice imaging in accordance with the collection order, the first center frequency, and the second center frequency.

An object is to perform multi-slice imaging which involves radiation of prepulse, without degrading image quality.

Hereinafter, embodiments of the MRI apparatus will be described in detail with reference to the drawings. In the following description, structural elements having substantially the same functions and configurations will be denoted by the same reference symbols, and a repetitive description of such elements will be given only where necessary.

Figure 1:
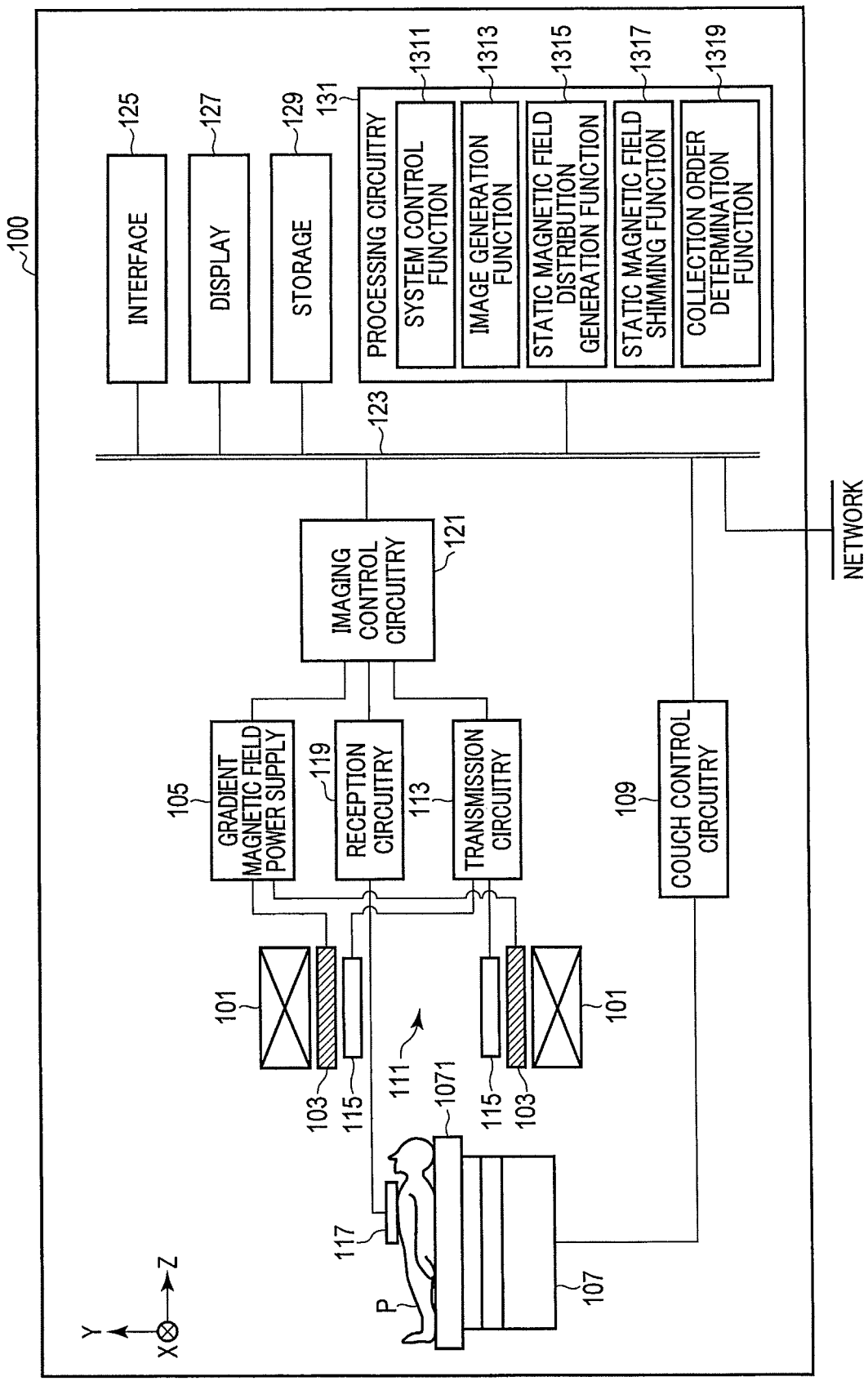
FIG. 1 is a diagram showing a configuration of an MRI apparatus in an embodiment.

The general configuration of an MRI apparatus 100 in the present embodiment will be described with reference to FIG. 1. FIG. 1 is a diagram showing a configuration of the MRI apparatus 100 in the present embodiment. As shown in FIG. 1, the MRI apparatus 100 includes a static magnetic field magnet 101, a gradient coil 103, a gradient magnetic field power supply 105, a couch 107, couch control circuitry 109, transmission circuitry (transmitter) 113, a transmitter coil 115, a receiver coil 117, reception circuitry (receiver) 119, imaging control circuitry (imaging controller) 121, a bus 123, an interface (input section) 125, a display 127, a storage 129, and processing circuitry (processor) 131. A subject P is not included in the MRI apparatus 100.

The static magnetic field magnet 101 is a magnet formed in a hollow, approximately cylindrical shape. The static magnetic field magnet 101 generates an approximately homogeneous static magnetic field ($B_0$) in the inner space. For example, a superconducting magnet or the like is used as the static magnetic field magnet 101.

The gradient coil 103 is a coil formed in a hollow, approximately cylindrical shape. The gradient coil 103 is arranged inside the static magnetic field magnet 101. The gradient coil 103 is formed by combining three coils respectively corresponding to the X-, Y-, and Z-axes which are orthogonal to each other. The Z-axis direction is the same direction as the direction of the static magnetic field. In addition, the Y-axis direction is a vertical direction, and the X-axis direction is a direction perpendicular to each of the Z-axis and the Y-axis. The three coils of the gradient coil 103 individually receive an electric current from the gradient magnetic field power supply 105 and respectively generate gradient magnetic fields in which magnetic field intensity changes along each of the X-, Y-, and Z-axes.

The gradient magnetic fields of the X, Y, and Z-axes generated by the gradient coil 103 form, for example, a gradient magnetic field for slice selection, a gradient magnetic field for phase encoding, and a gradient magnetic field for frequency encoding (also referred to as a readout gradient magnetic field). The gradient magnetic field for slice selection is used to determine an imaging slice at will. The gradient magnetic field for phase encoding is used to change the phase of an MR signal in accordance with the spatial position. The gradient magnetic field for frequency encoding is used to change the frequency of an MR signal in accordance with the spatial position. The gradient magnetic fields of the X, Y, and Z-axes generated by the gradient coil 103 are used as a re-convergence pulse in which the direction of the gradient magnetic field is twice reversed in order to re-converge the phase of spins on the X-Y plane in a gradient echo method. In addition, the gradient magnetic fields of the X-, Y-, and Z-axes generated by the gradient coil 103 are used as offset of first-order shimming of a static magnetic field, which will be described later.

The gradient magnetic field power supply 105 is a power supply device that supplies an electric current to the gradient coil 103 under the control of the imaging control circuitry 121.

The couch 107 is an apparatus including a couch top 1071 on which a subject P is placed. The couch 107 inserts the couch top 1071 on which the subject P is placed into the bore 111 under the control of the couch control circuitry 109. The couch 107 is installed in, for example, an examination room in such a manner that the longitudinal axis of the couch 107 is parallel to the central axis of the static magnetic field magnet 101.

The couch control circuitry 109 is circuitry that controls the couch 107. The couch control circuitry 109 drives the couch 107 in accordance with an operator's instruction via the interface 125 to move the couch top 1071 in a longitudinal direction and a vertical direction.

The transmitter 113 supplies a high-frequency pulse modulated by a Larmor frequency to the transmitter coil 115 by the control of the imaging control circuitry 121.

The transmitter coil 115 is an RF coil provided inside the gradient coil 103. The transmitter coil 115 generates an RF pulse corresponding to a radio frequency magnetic field in accordance with an output from the transmission circuitry 113. The transmitter coil 115 is, for example, a whole-body coil (WB coil) including a plurality of coil elements. The WB coil may be used as a transmitter/receiver coil. The transmitter coil 115 may also be a WB coil made of a single coil.

The receiver coil 117 is an RF coil provided inside the gradient coil 103. The receiver coil 117 receives MR signals that are emitted from the subject P, caused by a radio frequency magnetic field. The receiver coil 117 outputs the received MR signals to the receiver 119. The receiver coil 117 is a coil array including, for example, one or more, typically, a plurality of coil elements. In FIG. 1, the transmitter coil 115 and the receiver coil 117 are illustrated as separate RF coils; however, the transmitter coil 115 and the receiver coil 117 may be realized by an integrated transmitter/receiver coil. The transmitter/receiver coil is, for example, a local transmitter/receiver RF coil, such as a head coil, which serves an imaging target in the subject P.

The reception circuitry 119 generates a digital MR signal (hereinafter referred to as "MR data") based on the MR signal output from the receiver coil 117 under the control of the imaging control circuitry 121. Specifically, the reception circuitry 119 performs various types of signal processing on the MR signal output from the receiver coil 117, and then performs analog-to-digital (A/D) conversion on the data subjected to the various types of signal processing. The reception circuitry 119 samples the A/D-converted data. The reception circuitry 119 thereby generates MR data. The reception circuitry 119 outputs the generated MR data to the imaging control circuitry 121.

The imaging control circuitry 121 controls, for example, the gradient magnetic field power supply 105, the transmission circuitry 113, and the reception circuitry 119 in accordance with an imaging protocol output from the processing circuitry 131 to perform imaging on the subject P. The imaging protocol includes various pulse sequences corresponding to the examination. The imaging protocol defines the magnitude of the current supplied from the gradient magnetic field power supply 105 to the gradient coil 103, timing of the supply of the current from the gradient magnetic field power supply 105 to the gradient coil 103, the magnitude and time width of the high frequency pulse supplied from the transmission circuitry 113 to the transmitter coil 115, timing of the supply of the high frequency pulse from the transmission circuitry 113 to the transmitter coil 115, and timing of reception of the MR signal at the receiver coil 117, etc.

The bus 123 is a transmission path for transmitting data between the interface 125, the display 127, the storage 129, and the processing circuitry 131. The bus 123 may be connected via, for example, a network to various physiological signal measuring devices, an external storage apparatus, and various modalities.

The interface 125 includes a circuit that receives various instructions and information inputs from the operator. The interface 125 inputs, in accordance with an operator's input, a collection range (hereinafter "first collection range") in which MR signals (hereinafter "first MR signals) are collected for shimming imaging, which will be described later. The interface 125 inputs, to a locator image, a collection range (hereinafter "second collection range") in which MR signals (hereinafter "second MR signals) are collected for multi-slice imaging, which will be described later, in accordance with an operator's input. The second collection range overlaps at least a part of the first collection range. The first collection range may be a same imaging region as the second collection range.

The interface 125 includes a circuit relating to, for example, a pointing device such as a mouse, or an input device such as a keyboard. The circuit included in the interface 125 is not limited to a circuit relating to a physical operational component, such as a mouse or a keyboard. For example, the interface 125 may include an electrical signal processing circuit which receives an electrical signal corresponding to an input operation from an external input device provided separately from the present MRI apparatus 100 and outputs the received electrical signal to various circuits.

The display 127 displays, for example, various MR images generated by an image generation function 1313, and various types of information relating to imaging and image processing, under the control of a system control function 1311 in the processing circuitry 131. The display 127 is, for example, a CRT display, a liquid crystal display, an organic EL display, an LED display, a plasma display, or any other display or a monitor known in this technical field.

The storage 129 stores, for example, MR data filled in the k-space with the use of the image generation function 1313, image data generated by the image generation function 1313, imaging protocols, imaging conditions including the imaging parameters defining the imaging protocols, and the like. The storage 129 stores programs corresponding to various functions executed by the processing circuitry 131. The storage 129 stores a program for calculating a 0-order shimming value and first-order shimming values by static magnetic field shimming in each slice (hereinafter, a calculation program). The 0-order shimming value correspond to a resonance frequency of water in each of the slices in multi-slice imaging. The first-order shimming values correspond to values of currents respectively supplied to the three gradient coils from the gradient magnetic power supply 105 so as to correct the X, Y, and Z components of inhomogeneity of the static magnetic field in each of the slices relating to the multi-slice imaging.

The storage 129 is, for example, a semiconductor memory element, such as a RAM (Random Access Memory) and a flash memory, a hard disk drive, a solid state drive, or an optical disk, etc. The storage device 129 may also be, for example, a drive that performs reading and writing various kinds of information on a portable storage medium such as a CD-ROM drive, a DVD drive, or a flash memory.

The processing circuitry 131 includes, as hardware resources, a processor and a memory such as a ROM and a RAM, which are not shown, and controls the present MRI apparatus 100. For example, the processing circuitry 131 includes a system control function 1311, an image generation function 1313, a static magnetic field distribution generation function 1315, a static magnetic field shimming function 1317, and a collection order determination function 1319. The various types of functions executed by the system control function 1311, the image generation function 1313, the static magnetic field distribution generation function 1315, the static magnetic field shimming function 1317, and the collection order determination function 1319, are stored in the storage 129 in a form of a computer-executable program. The processing circuitry 131 is a processor, which reads a program corresponding to each of those functions from the storage 129 and executes the program to realize the function corresponding to the program. In other words, the processing circuitry 131, in a state where each of the programs is read, has a plurality of the functions etc. shown in the processing circuitry 131 of FIG. 1.

FIG. 1 illustrates the case where the various functions are realized in single processing circuitry 131; however, the processing circuitry 131 may be constituted by a combination of a plurality of independent processors, and the functions may be realized by the processors executing the programs. In other words, each of the above-mentioned functions may be configured as a program, and executed by a single processing circuit; alternatively, a specific function may be implemented in a dedicated independent program-execution circuit. The system control function 1311, the image generation function 1313, the static magnetic field distribution generation function 1315, the static magnetic field shimming function 1317, the collection order determination function 1319 of the processing circuitry 131 are examples of a system controller, an image generator, a static magnetic field distribution generator, a static magnetic field shimming unit, and a collection order determination unit, respectively.

The term "processor" used in the above description means, for example, a CPU (Central Processing Unit), a GPU (graphics processing unit), or circuitry such as an ASIC (application specific integrated circuit), or a programmable logic device (e.g., an SPLD (simple programmable logic device), a CPLD (complex programmable logic device), or an FPGA (field programmable gate array)).

The processor realizes various functions by reading and executing programs stored in the storage 129. The programs may be directly integrated in a circuit of the processor, instead of being stored in the storage 129. In this case, the function is realized by reading and executing the program integrated into the circuitry. Similarly, the bed control circuitry 109, the transmission circuitry 113, the reception circuitry 119, and the imaging control circuitry 121, etc. are constituted by an electronic circuit such as the above-described processor.

The processing circuitry 131 controls the MRI apparatus 100 by the system control function 1311. Specifically, the processing circuitry 131 reads the system control program stored in the storage 129, loads it in the memory, and controls each circuitry of the present MRI apparatus 100 in accordance with the loaded system control program. For example, the processing circuitry 131 reads an imaging protocol from the storage 129 based on imaging condition that has been input by an operator through the interface 125. The processing circuitry 131 may also generate an imaging protocol based on conditions for imaging. The processing circuitry 131 transmits the imaging protocol to the imaging control circuitry 121, and controls imaging on the subject P.

The processing circuitry 131 fills MR data along a readout direction of k-space in accordance with an intensity of the readout gradient magnetic field by the image generation function 1313. The processing circuitry 131 generates an MR image by executing a Fourier transform to the MR data filled in k-space. The processing circuitry 131 outputs the MR image to the display 127 and the storage device 129.

This is the description of the general configuration of the MRI apparatus 100 according to the present embodiment. In the following, the static magnetic field distribution generation function 1315, the static magnetic field shimming function 1317, the collection order determination function 1319 will be described in detail in connection with the description of the collection order determination process.

(Collection Order Determination Process)

The collection order determination process is a process of determining an order of slice collection in a multi-slice imaging based on a center frequency of an RF pulse of each slice determined by static magnetic field shimming (hereinafter, "first center frequency") and a center frequency of a pre-pulse (hereinafter, "second center frequency"). A first center frequency is for example a resonance frequency of water in each of the slices. A second center frequency is for example a resonance frequency of fat in each of the slices. The static magnetic field shimming is a process of correcting inhomogeneity of a static magnetic field in a second collection range for each of the slices relating to multi-slice imaging, with the use of a static magnetic field distribution generated by a first MR signal collected by shimming imaging in a first collection range. Inhomogeneity of the static magnetic field is caused by the subject P laid in the static magnetic field. For this reason, the shimming imaging is performed while the subject P is being inserted in the bore 111.

The shimming imaging is performed through, for example, multi-slice imaging adopting a double-echo method in which two different echo time intervals are used. At this time, the imaging control circuitry 121 sets two echo time intervals so that a difference between the resonance frequencies of water and fat (3.5 ppm) is not reflected in a phase-difference image from which a static magnetic field distribution originates. The shimming imaging is not limited to the multi-slice imaging adopting a double-echo method, and may be performed by other imaging methods, such as a multi-slice imaging method adopting a triple-echo method in which three different echo time intervals are used. Hereinafter, for a specific explanation, the description will be given on the assumption that the shimming imaging is performed by a double-echo method in multi-slice imaging. The multi-slice imaging performed after static magnetic field shimming is an imaging procedure for collecting second MR signals performed in each of the slices along with radiation of a non-region-selective prepulse corresponding to each of the slices in a second collection range.

Figure 2:
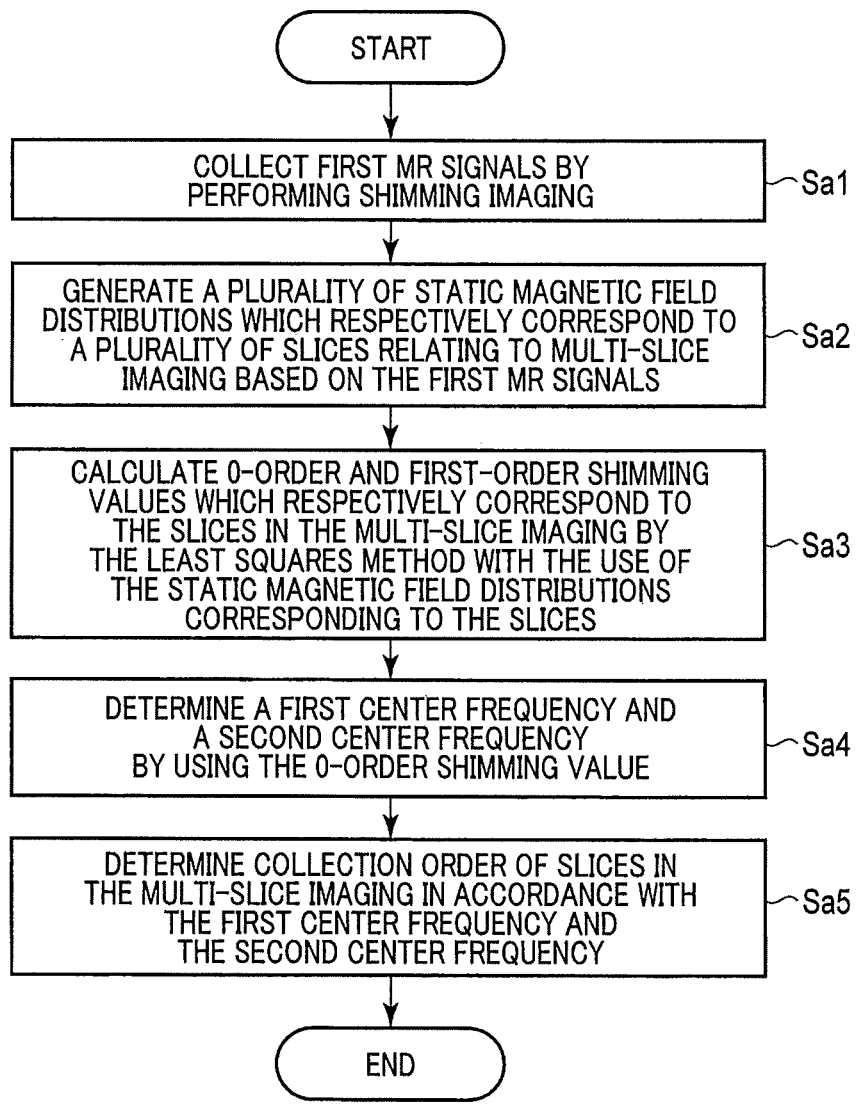
FIG. 2 is a diagram showing an example of the steps of a collection order determination process in the embodiment.

FIG. 2 is a diagram showing an example of the steps of the collection order determination process. Hereinafter, the collection order determination process will be described with reference to FIG. 2.

(Step Sa1)

The imaging control circuitry 121 collects first MR signals by performing shimming imaging in advance of performing the multi-slice imaging to the second collection range. Specifically, the imaging control circuitry 121 controls the gradient magnetic power supply 105, the transmission circuitry 113, and the reception circuitry 119, in accordance with the double-echo method. The imaging control circuitry 121 collects three-dimensional first MR signals via the receiver coil 117 and the reception circuitry 119 by shimming imaging. In other words, the imaging control circuitry 121 collects first MR signals corresponding to two echo time intervals. The center frequency of an RF pulse in shimming imaging is determined by measurement of a resonance frequency distribution performed before the shimming imaging and the collection of MR signals relating to the locator image.

(Step Sa2)

The processing circuitry 131 that realizes the static magnetic field distribution generation function 1315 generates a plurality of static magnetic field distributions respectively corresponding to the slices relating to multi-slice imaging, based on the first MR signals. Specifically, the processing circuitry 131 generates two complex images respectively corresponding to the two echo time intervals, based on the first MR signals of each of the slices in the first collection range. The processing circuitry 131 performs complex conjugate calculation to one of the two complex images, and calculates a product of the complex image to which complex conjugate calculation has been performed and the other complex image to which complex conjugate calculation has not been performed. The processing circuitry 131 generates a phase-difference image by using a phase of the calculated product.

The processing circuitry 131 generates, by the static magnetic field distribution generation function 1315, an intensity image by using at least one of the two complex images. The processing circuitry 131 extracts a background region in the phase-difference image based on the intensity image. The processing circuitry 131 removes the background from the phase-difference image by using the extracted background region. The processing circuitry 131 performs a phase unwrap process, in consideration of continuity of phase, to the phase-difference image from which the background has been removed. The processing circuitry 131 performs linear conversion to a value of the phase-difference in each pixel in the phase-difference image to which the phase unwrap processing has been performed, by using an echo interval corresponding to a difference of the two echo time intervals and a gyromagnetic ratio, thereby generating a two-dimensional static magnetic field distribution as frequency information. The processing circuitry 131 generates a three-dimensional static magnetic field distribution by coupling multiple two-dimensional static magnetic field distributions.

The processing circuitry 131 specifies an imaging position in the second collection range, namely a plurality of slices, in the first collection range. The processing circuitry 131 generates a plurality of static magnetic field distributions respectively corresponding to the plurality of slices based on the three-dimensional static magnetic field distribution and the specified imaging position. The generation of the plurality of static magnetic field distributions, respectively corresponding to the slices in the second collection range, corresponds to the reformatting of the three-dimensional static magnetic field distribution to the slices, for example cross-section conversion. The plurality of static magnetic field distributions corresponding to the slices may be stored in the storage 129 as a default in accordance with a body part targeted for imaging, sex, and age etc. In this case, the process in step Sa1 and the process in step Sa2 become unnecessary.

(Step Sa3)

The processing circuitry 131 that realizes the static magnetic field shimming function 1317 calculates 0-order shimming value and first-order shimming values corresponding to each of the slices in the multi-slice imaging, by using a least-squares method in which the static magnetic field distribution corresponding to each slice is adopted, in consideration of the 0-order and first-order components of inhomogeneity of the static magnetic field distribution. Specifically, the processing circuitry 131 reads a calculation program from the storage 129, and develops it in its own memory. Hereinafter, static magnetic field shimming in the present embodiment will be described.

An example of basic expression relating to the static magnetic field shimming is shown in the expression (1) below.

$$b_0'(x,y,z) = a_0 + a_1 x + a_2 y + a_3 z + b_0(x,y,z) \quad (1)$$

Herein, (x,y,z) in the expression (1) represents a three-dimensional position in a space. Specifically, the variable x represents a position with respect to a center of the static magnetic field in the horizontal direction (X-axis) (hereinafter "magnetic field center"), which is defined as an origin. The variable y represents a position with respect to the magnetic field center in the vertical direction (Y-axis) as an origin. The variable z represents a position with respect to the magnetic field center in the axial direction (Z-axis) as an origin. Herein, a unit of each of x, y, z is [m]. a0 in the expression (1) is degree-0 shimming value. a0 represents a value to which a minus sign is put to a center frequency of an RF pulse. A unit of a0 is [ppm]. a1, a2, and a3 in the expression (1) are degree-1 shimming values. Specifically, a1, a2, and a3 represent an amount of change in a resonance frequency per unit length for each of the X-, Y-, and Z-axes, respectively. An amount of change in a resonance frequency per unit length corresponds to a gradient of the gradient magnetic field, in other words, a value of current applied to the gradient coil 103. A unit of $a_1$, $a_2$, $a_3$ is [ppm/m]. $b_0(x,y,z)$ in the expression (1) is a resonance frequency in the position (x,y,z) before the static magnetic field shimming is performed. In other words, $b_0(x,y,z)$ is a result of converting a three-dimensional static magnetic field distribution generated in step Sa2 into a resonance frequency, that is a distribution of resonance frequency representing inhomogeneity of a static magnetic field. A unit of $b_0(x,y,z)$ is [ppm]. $b_0'(x,y,z)$ is a difference value representing a difference between a resonance frequency in the position (x,y,z) after shimming and a center frequency of an RF pulse. A unit of $b_0'(x,y,z)$ is [ppm].

The left side of the expression (1), namely the difference value regarding the resonance frequency after shimming and the center frequency of the RF pulse, becomes a desirable condition for static magnetic field shimming if the value is smaller. If a set of all positions of a plurality of pixels in a foreground region (hereinafter, foreground pixels) corresponding to a non-foreground region (hereinafter, a position set S) is considered for an image representing the three-dimensional static magnetic field distribution generated in step Sa2, the position set S can expressed by the expression (2) below:

$$S \in \{(x_i, y_i, z_i)^T\}, \; i=1,2,\ldots,N \quad (2)$$

In the expression (2), i represents a serial number of a foreground pixel. N represents a total number of the foreground pixels.

At this time, N expressions (1) can be established for all the foreground pixels in the image of the three-dimensional static magnetic field distribution. If the N expressions (1) for all the foreground pixels are combined, the expression (3) below can be obtained:

$$\begin{pmatrix} b'_0(x_1, y_1, z_1) \\ \vdots \\ b'_0(x_N, y_N, z_N) \end{pmatrix} = \begin{pmatrix} 1 & x_1 & y_1 & z_1 \\ \vdots & \vdots & \vdots & \vdots \\ 1 & x_N & y_N & z_N \end{pmatrix} \begin{pmatrix} a_0 \\ a_1 \\ a_2 \\ a_3 \end{pmatrix} + \begin{pmatrix} b_0(x_1, y_1, z_1) \\ \vdots \\ b_0(x_N, y_N, z_N) \end{pmatrix} \quad (3)$$

In the expression (3), if a vector b', a matrix X, a vector a, and a vector b are defined as follows:

$$b' = \begin{pmatrix} b'_0(x_1, y_1, z_1) \\ \vdots \\ b'_0(x_N, y_N, z_N) \end{pmatrix}, X = \begin{pmatrix} 1 & x_1 & y_1 & z_1 \\ \vdots & \vdots & \vdots & \vdots \\ 1 & x_N & y_N & z_N \end{pmatrix},$$

$$a = \begin{pmatrix} a_0 \\ a_1 \\ a_2 \\ a_3 \end{pmatrix}, b = \begin{pmatrix} b_0(x_1, y_1, z_1) \\ \vdots \\ b_0(x_N, y_N, z_N) \end{pmatrix}$$

The expression (3) can then be expressed as shown in the expression (4) below:

$$b' = Xa + b \quad (4)$$

As aforementioned, the smaller each element of the vectors in the left side of the expression (1), namely, the left side of the expression (3) or (4), actually is, the more ideal it becomes for the static magnetic field shimming. Accordingly, homogeneity of the static magnetic field is defined as an amplitude of the vector b', and the cost function E regarding the vector a, which is obtained by combining a 0-order shimming value and first-order shimming values, is defined as the expression (5).

$$E(a) = (Xa+b)^T \Omega^{-1} (Xa+b) \quad (5)$$

The matrix $\Omega$ in the expression (5) is a matrix for normalization in accordance with the importance of each element in the vector b' and correlation between the elements. For example, if the matrix $\Omega$ is a unitary matrix, the cost function is simply a sum of squares of a vector element. If the matrix $\Omega$ is a covariance matrix relating to the vector b', the cost function is a square of Mahalanobis' distance. The vector a, which is a combination of the 0-order shimming value and first-order shimming values, and that also minimizes the cost function (5), can be determined by the expression (6) shown below with the use of a least-squares method.

$$\hat{a} = \mathrm{argmin}_a E(a) \quad (6)$$

Hereinafter, static magnetic field shimming per slice will be described. If a set of positions $S_j$ of a plurality of foreground pixels per slice of the second collection range is considered for the second collection range relating to the multi-slice collection in which per-slice static magnetic field shimming is performed, the position set $S_j$ can expressed by the expression (7) below, for example:

$$S_j \in \{(x_i, y_i, z_i)^T\}, j=1,2,\ldots,M, i=1,2,\ldots,N_j \quad (7)$$

In the expression (7), j represents a serial number of the slices of the second collection range. M in the expression (7) represents the number of slices in the second collection range. i in the expression (7) represents a serial number of a foreground pixel. $N_j$ represents the total number of the foreground pixels in a slice j.

In the per-slice static magnetic field shimming, $N_j$ expressions (1) can be established for all the foreground pixels $N_j$ for each slice j in the second collection range. In the slice j, the vector $b_j'$, the matrix $X_j$, the vector $a_j$, and the vector $b_j$ are defined as follows:

$$b'_j = \begin{pmatrix} b'_0(x_1, y_1, z_1) \\ \vdots \\ b'_0(x_{N_j}, y_{N_j}, z_{N_j}) \end{pmatrix}, x_j = \begin{pmatrix} 1 & x_1 & y_1 & z_1 \\ \vdots & \vdots & \vdots & \vdots \\ 1 & x_{N_j} & y_{N_j} & z_{N_j} \end{pmatrix}$$

$$a_j = \begin{pmatrix} a_0(j) \\ a_1(j) \\ a_2(j) \\ a_3(j) \end{pmatrix}, b_j = \begin{pmatrix} b_0(x_1, y_1, z_1) \\ \vdots \\ b_0(x_{N_j}, y_{N_j}, z_{N_j}) \end{pmatrix}$$

The vector $b_j$ corresponds to the entirety of foreground pixels in the static magnetic field distribution corresponding to the slice j, among the plurality of static magnetic field distributions generated in step Sa2. In the slice j, if the $N_j$ expressions (1) for all the foreground pixels are combined, the expression (8) below can be obtained:

$$b_j' = X_j a_j + b_j \quad (8)$$

For the expression (8), the processing circuitry 131 defines a cost function similar to the expression (5) via the static magnetic field shimming function 1317. The processing circuitry 131 calculates the vector $a_j$, which is a combination of the 0-order and first-order shimming values, by the least-squares method with which the cost function relating to the expression (8) is minimized. In other words, the processing circuitry 131 calculates M patterns of vector $a_j$ for each slice in the second collection region.

The processing circuitry 131 that realizes the static magnetic field shimming function 1317 causes the storage 129 to store the 0-order and first-order shimming values calculated for each slice in association with the slices relating to the calculation of the 0-order and first-order shimming values. The processing circuitry 131 may cause the storage 129 to store the static magnetic field distribution for each slice after the static magnetic field shimming is performed (hereinafter, "post-shimming distribution") in association with each aforementioned slice. The post-shimming distribution is calculated for each slice by the processing circuitry 131 through substituting the 0-order and first-order shimming values calculated by the calculation program and the static magnetic field distributions, generated in step Sa2, into the expression (8). For example, the post-shimming distribution corresponding to slice j corresponds to vector $b_j'$.

(Step Sa4)

The processing circuitry 131 that realizes the static magnetic field shimming function 1317 determines a first center frequency of each of the RF pulses respectively corresponding to the slices in the multi-slice imaging, and a second center frequency of the plurality of prepulses respectively corresponding to the slices, based on the calculation result obtained through the static magnetic field shimming.

Specifically, the processing circuitry 131 that realizes the static magnetic field shimming function 1317 determines a first center frequency by inverting the sign of a 0-order shimming value calculated for each slice, in other words, multiplying a 0-order shimming value with a negative sign. The processing circuitry 131 determines a second frequency shifted by 3.5 ppm from the first center frequency determined for each of the slices. In other words, the processing circuitry 131 determines the first center frequency of the RF pulse corresponding to each of the slices and the second center frequency of each prepulse based on the static magnetic field distribution. In this case, the processing circuitry 131 may cause the display 127 to display the determined first center frequency and second center frequency, along with the plurality of post-shimming distributions respectively corresponding to the slices. The processing circuitry 131 causes the storage 129 to store the first center frequency and second center frequency determined for each of the slices in association with each aforementioned slice. By way of the processing from step Sa1 through step Sa4, the static magnetic field shimming to each of the slices in the multi-slice imaging, namely per-slice static magnetic field shimming, is complete.

(Step Sa5)

The processing circuitry 131 that realizes the collection order determination function 1319 determines a collection order of slices in which the second MR signals are collected in the multi-slice imaging, in accordance with at least one of the first center frequency and the second center frequency. For example, the processing circuitry 131 determines a collection order of slices in descending order of the plurality of first center frequencies respectively corresponding to the slices, starting with the largest frequency. Instead of using a plurality of first center frequencies, the processing circuitry 131 may determine a collection order of slices in descending order of the plurality of second center frequencies respectively corresponding to the slices, starting with the largest frequency.

In the following, as an example, let us suppose that each of the RF pulses used in the multi-slice imaging has a frequency band that includes the first center frequency and excites magnetization of water in each of the slices (hereinafter, "first band"). Each of the prepulses used in the multi-slice imaging is a fat-suppression pulse that includes the second center frequency and a frequency band that suppresses the generation of the second MR signals that originate from fat tissue (hereinafter "second band"). When a collection order is determined with the use of the first center frequencies and the second center frequencies, the processing circuitry 131, that realizes the collection order determination function 1319, determines a collection order. This ensures that the second band of the prepulse relating to the collection slice from which the second MR signals are collected does not overlap the first band of the RF pulse that is applied, after the collection of the second MR signals, to a slice different to the collection slice from which the second MR signals are collected.

Figure 3:
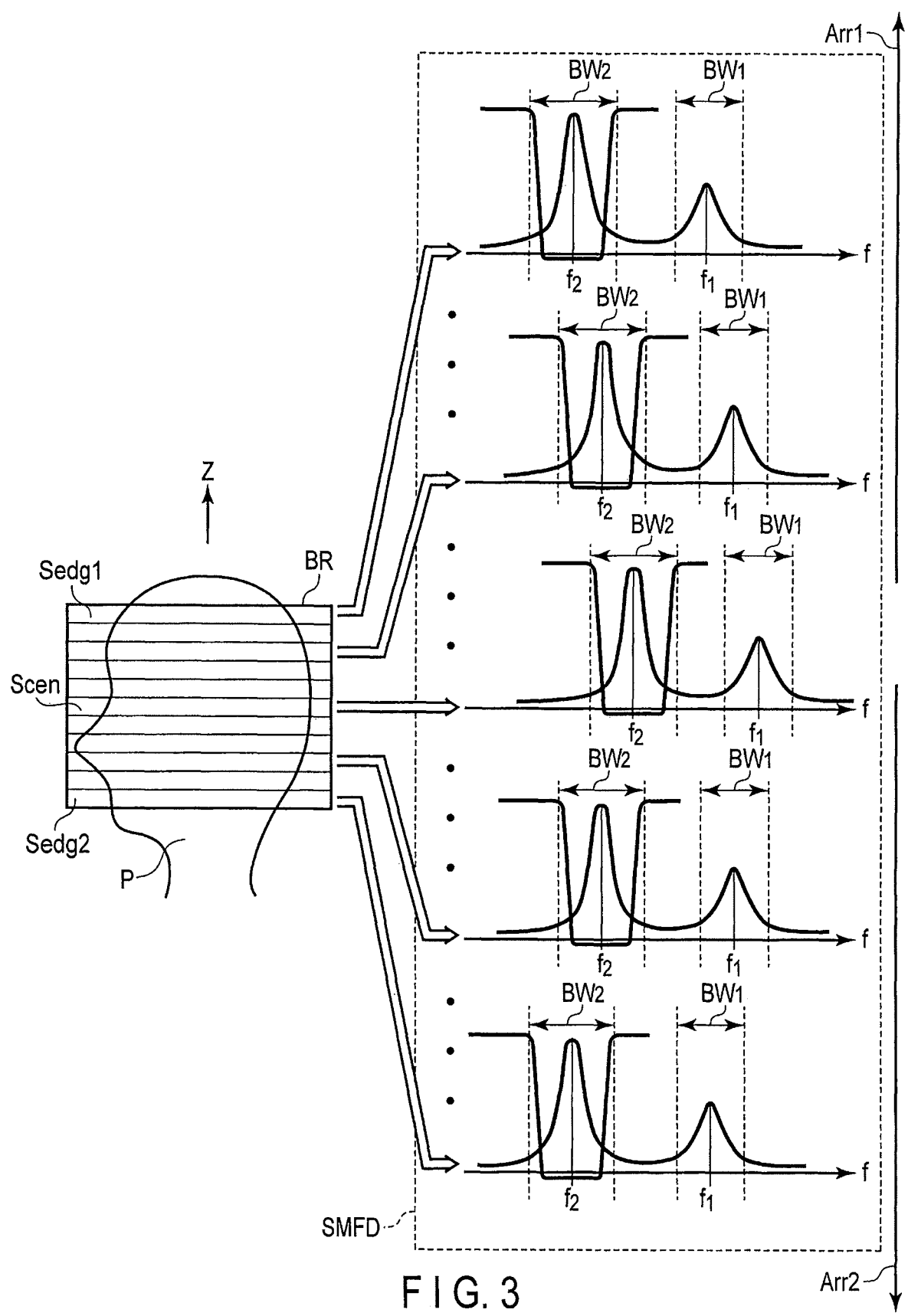
FIG. 3 is an explanatory drawing of a concept relating to a determination of a slice correction order according to the embodiment in a case where a second collection range is a head.

FIG. 3 is an explanatory drawing of a concept relating to the slice correction order determination in a case where the second collection range BR is a head. Sedge1 and Sedge2 in FIG. 3 show two slices corresponding to the edges of the second collection range BR (hereinafter, the top-edge slice and the bottom-edge slice). Scen in FIG. 3 shows a slice corresponding to the center of the second collection range BR (hereinafter, "the center slice"). SMFD in FIG. 3 is a drawing illustrating a plurality of post-shimming distributions respectively corresponding to the slices. In each of the post-shimming distributions SMFD in FIG. 3, the resonance frequency of water (first center frequency $f_1$) is separated from the resonance frequency of fat (second center frequency $f_2$) for the sake of explanation. If, for example, a triple-echo method is used in the shimming imaging, a plurality of post-shimming distributions SMFD as shown in FIG. 3 are obtained.

Specifically, the processing circuitry 131, that realizes the collection order determination function 1319, determines a collection order of slices in descending order of the first center frequencies $f_1$ or the second center frequencies $f_2$, along with the arrow Arr1 directed from the center slice Scen toward the top-edge slice Sedge1, and the arrow Arr2 directed from the center slice Scen toward the bottom-edge slice Sedge2.

Specifically, the processing circuitry 131, that realizes the collection order determination function 1319, determines a collection order. This ensures that during the multi-slice imaging, a second band BW2, relating to the collection slice which pertains to the collection of the second MR signals in a preceding stage, does not overlap a first band BW1 of an RF pulse applied to a slice different to that from which the second MR signals are collected, subsequently to the collection of the second MR signals in the collection slice in the preceding stage. The processing circuitry 131 causes the storage 129 to store the determined collection order.

A plurality of first center frequencies $f_1$ and second center frequencies $f_2$, respectively corresponding to the slices, are displayed on the display 127 along with the plurality of post-shimming distributions respectively corresponding to the slices. The processing circuitry 131, that realizes the collection order determination function 1319, may determine a collection order in accordance with an operator's instruction input via the interface 125.

The collection order determined in step Say may be displayed on the display 127, along with the plurality of post-shimming distributions, the plurality of the first center frequencies $f_1$, and the plurality of second center frequencies $f_2$. If the multi-slice imaging is performed to a body part targeted for imaging in the same subject P at a later date, the processing circuitry 131, that realizes the collection order determination function 1319, may read the collection order from the storage 129 and cause the display 127 to display the collection order. In these cases, the processing circuitry 131 may change the collection order to a new collection order in accordance with an operator's instruction regarding the collection order. At this time, the processing circuitry 131 updates the collection order stored in the storage 129 to the new collection order, and causes the storage 129 to store the new collection order. The processing circuitry 131 may further cause the storage 129 to store the determined collection order in association with patient's information relating to the subject P, imaging conditions relating to the subject P, or preset data relating to imaging conditions (e.g., data in which imaging conditions for respective imaging-targeted body parts are preset in advance of a main scan).

After the process in step Say, the imaging control circuitry 121 performs multi-slice imaging using current values corresponding to the first-order shimming values, in accordance with the first center frequencies $f_1$, the second center frequencies $f_2$, and the determined collection order. If the static magnetic field shimming for calculating first-order shimming values is not performed, the imaging control circuitry 121 may perform the multi-slice imaging, in accordance with the first center frequencies $f_1$, the second center frequencies $f_2$, and the determined collection order, without using current values corresponding to the first-order shimming values. When an operation to change the collection order is input via the interface 125, the imaging control circuitry 121 performs the multi-slice imaging in accordance with the first center frequencies $f_1$, the second center frequencies $f_2$, and the determined collection order.

According to the above-described configuration, the following advantageous effects can be obtained.

According to the MRI apparatus 100 of the present embodiment, a plurality of static magnetic field distributions respectively corresponding to the slices in the multi-slice imaging are generated based on first MR signals collected by the shimming imaging, a plurality of first center frequencies $f_1$ and a plurality of second center frequencies $f_2$ are determined based on the generated static magnetic field distributions; a collection order of slices in which second MR signals are collected in the multi-slice imaging in accordance with at least either one of the first center frequencies $f_1$ or the second center frequencies $f_2$ are determined; and the multi-slice imaging is thereby performed in accordance with the determined collection order, first center frequencies $f_1$, and second center frequencies $f_2$. For example, according to the present MRI apparatus 100, a collection order can be determined in such a manner that the second band BW2 of a prepulse applied to the second collection range relating to the collection slice in which second MR signals are collected does not overlap the first band BW1 of an RF pulse applied to a slice different from the collection slice, after the collection of the second MR signals in the collection slice.

Furthermore, according to the present MRI apparatus 100, the determined collection order is displayed on display 127 with the first center frequencies $f_1$ and the second center frequencies $f_2$, and the collection order is changed to a new collection order in accordance with an operator's instruction regarding the displayed collection order, thereby performing the multi-slice imaging in accordance with the first center frequencies $f_1$, the second center frequencies $f_2$, and the new collection order. It is thus possible to perform the multi-slice imaging in the same imaging order in the multi-slice imaging performed to a single subject, according to the present MRI apparatus 100. For example, the collection order relating to the multi-slice imaging performed to a subject in the past may be stored in the storage 129 in association with the subject. In this case, if the multi-slice imaging is performed again to the subject for progress observation, etc., the collection order can be read from the storage 129, so that the multi-slice imaging can be performed in the same imaging order as the past multi-slice imaging, without the need to perform a collection order determination process once again. According to the present MRI apparatus 100, it is possible to adjust or change the collection order as appropriate, in accordance with an operator's desire.

According to the MRI apparatus 100 of the present embodiment as described above, it is possible to prevent a prepulse radiated for the collection of second MR signals in a preceding stage of the multi-slice imaging from affecting second MR signals collected in a subsequent stage of the multi-slice imaging. It is thus possible to improve image quality of an MR image generated in the multi-slice imaging with the use of the multi-slice imaging method in which a collection order determination process is performed by the present MRI apparatus 100.

First Application Example

In the present application example, a collection order of slices is determined, while interference between slices due to an RF pulse in the multi-slice imaging (crosstalk) is avoided. Interference between slices is caused when a first band BW1 of an RF pulse in a collection slice overlaps a slice adjacent to the collection slice. For this reason, in addition to the method of determining a collection order in the present embodiment, in the process of step Sa7, the processing circuitry 131, that realizes the collection order determination function 1319, determines a collection order so as to avoid performing imaging sequentially on two adjacent slices in the multi-slice imaging. In other words, in the first application example, a collection order of slices is determined through adopting a technical idea of interleave collection as a constraint for the process of step Sa5.

According to the above-described configuration, the following advantageous effects can be obtained in addition to the advantageous effects described in the present embodiment.

According to the MRI apparatus 100 in the present embodiment, a collection order of slices can be determined without performing imaging in adjacent slices in a row during the multi-slice imaging. According to the present MRI apparatus 100, it is thereby possible to solve interference between slices due to an RF pulse and to further improve image quality of an MR image generated by the multi-slice imaging.

Second Application Example

In the second application example, a collection order of slices is determined in such a manner that slices of similar static magnetic field distributions after the performance of the static magnetic field shimming by the static magnetic field shimming function 1317, namely similar post-shimming distributions, are collected closely together in the collection order. In addition to the method of determining a collection order in the foregoing embodiment, the processing circuitry 131, that realizes the collection order determination function 1319, determines, in the process of step Sa5, a collection order in accordance with a degree of similarity among the post-shimming distributions respectively corresponding to the slices. In the second application example, a collection order of slices is determined on a constraint that imaging is sequentially performed on the slices which have similarity in the process of step Sa5.

Specifically, the processing circuitry 131 that realizes the collection order determination function 1319 calculates a degree of similarity after the post-shimming distribution in the slices in the process of step Sa5. The processing circuitry 131 calculates a degree of similarity by applying, for example, mutual correlation processing to the post-shimming distributions. Subsequently, in addition to the method of determining a collection order in the foregoing embodiment, the processing circuitry 131 determines a collection order in such a manner that the similarity between two slices to which multi-slice imaging is sequentially performed becomes higher. The second application example may be performed in a combination with the first application example.

According to the above-described configuration, the following advantageous effects can be obtained in addition to the advantageous effects described in the foregoing embodiment.

According to the MRI apparatus 100 of the embodiment, a degree of similarity between post-shimming distributions in the slices is calculated, and a collection order of slices can be determined so that a degree of similarity between two slices to which the multi-slice imaging is sequentially performed becomes high. In other words, according to the present MRI apparatus 100, it is possible to put slices having similar post-shimming distributions close together in a collection order. It is thus possible to improve effects of fat-suppression in a collection slice with the use of a prepulse applied to the second collection range every time a second MR signal is collected in the multi-slice imaging, according to the present MRI apparatus 100. In other words, the present MRI apparatus 100 is capable of avoiding suppression of generation of water signals as much as possible, and suppressing generation of fat signals as much as possible when performing the multi-slice imaging with the use of a collection order determined by the collection order determination process. According to the MRI apparatus 100 as described above, it is possible to further improve image quality of an MR image generated in the multi-slice imaging.

Third Application Example

In the third application example, an offset of a gradient magnetic field with respect to a direction orthogonal to multiple slices in the second collection range is determined based on second center frequencies $f_2$, and a collection order is determined so that the second center frequencies $f_2$ of the two slices sequentially subjected to the multi-slice imaging become close with the use of the determined offset. In the third application example, a current value corresponding to a first-order shimming value will be referred to as a "first current value". In the process of step Sa3, the processing circuitry 131, that realizes the static magnetic field shimming function 1317, determines, as a first-order shimming value, a first current value corresponding to a gradient magnetic field intensity that makes a static magnetic field homogeneous in each of the slices in the second collection range, based on a plurality of static magnetic field distributions.

The processing circuitry 131, that realizes the static magnetic field shimming function 1317, determines, in the process of Sa5, a second current value corresponding to an offset of the gradient field with respect to a direction orthogonal to multiple slices in the second collection range, using the second center frequency $f_2$. If the slices are orthogonal to the Z-axis direction, the offset of the gradient magnetic field becomes the intensity of the gradient magnetic field with respect to the Z-axis. In this case, the post-shimming distributions respectively corresponding to the slices do not change as the offset of the gradient magnetic field is applied to all the slices. On the other hand, the first center frequency $f_1$ and the second center frequency $f_2$ in each of the slices are shifted in a frequency direction f of the post-shimming distribution shown in FIG. 3, in accordance with the offset of the gradient field.

The processing circuitry 131 that realizes the collection order determination function 1319 determines a collection order in such a manner that the second center frequencies $f_2$ of two slices sequentially subjected to the multi-slice imaging by using an offset become close, in addition to the method of determining a collection order according to the foregoing embodiment. The processing circuitry 131 determines a collection order of slices in descending order of proximity of the second center frequencies $f_2$ shown in FIG. 3, for example. In other words, in the third application example, a collection order of slices is determined by adopting the proximity of the second center frequencies $f_2$ shifted by the offset of the gradient field as a constraint in the process of step Sa5.

After the process of step Say, the imaging control circuitry 121 performs the multi-slice imaging using first and second current values corresponding to the first center frequencies $f_1$, the second center frequencies $f_2$, and the determined collection order. The present application example may be performed in a combination with at least one of the first application example and the second application example.

According to the above-described configuration, the following advantageous effects can be further obtained in addition to the advantageous effects described in the present embodiment.

According to the MRI apparatus 100 of the present embodiment, it is possible to determine a first current value corresponding to gradient field intensity that makes a static magnetic field distribution homogeneous in each of the slices of the second collection region based on the static magnetic field distribution (first-order shimming), to determine a second current value corresponding to an offset of a gradient magnetic field relating to a direction orthogonal to the multiple slices based on a second center frequency $f_2$, and to determine a collection order so that the second center frequencies $f_2$ of two slices sequentially subjected to the multi-slice imaging become close with the use of the determined offset. According to the present MRI apparatus 100, it is thereby possible to put slices having similar second center frequencies $f_2$ in an offset of a gradient field close in a collection order, and to improve effects of fat-suppression in a collection slice by a prepulse applied to a second collection range every time a second MR signal is collected in the multi-slice imaging. According to the MRI apparatus 100 as described above, it is possible to further improve image quality of an MR image generated in the multi-slice imaging.

Fourth Application Example

In the fourth application example, the first to third application examples are combined with the embodiment. The processing circuitry 131, that realizes the collection order determination function 1319, performs optimization processing to a technical idea relating to the embodiment and the first to third application examples in the process of step Say, thereby determining a collection order. For example, the processing circuitry 131 sets a first evaluation function in reference to ordering the first center frequencies $f_1$ in descending order, or the second center frequencies $f_2$ in descending order. The processing circuitry 131 sets a second evaluation function in reference to interference between slices due to an RF pulse. The processing circuitry 131 sets a third evaluation function in reference to a degree of similarity between static magnetic field distributions. The processing circuitry 131 sets a fourth evaluation function in accordance with a degree of proximity between the second center frequencies $f_2$ due to an offset of the gradient field. The processing circuitry 131 sets a combined evaluation function (hereinafter, "a combined function") by executing weighted addition to the first to fourth evaluation functions. The first to fourth evaluation functions, or the combined function, may be stored in the storage 129 in advance. The processing circuitry 131 performs optimization processing to the combined function to determine a collection order. The optimization processing is realized by, for example, minimization or maximization of an evaluation function.

The optimization processing is not limited to what is described above, and various types of optimization processing can be adopted. For example, the processing circuitry 131, that realizes the collection order determination function 1319, may perform the optimization processing to the combined function obtained by executing weighted addition to the third evaluation function and the fourth evaluation function, on a constraint, for example, that the first center frequencies $f_1$ are ordered in descending order or the second center frequencies $f_2$ are ordered in descending order, and that collection is not sequentially performed to adjacent slices.

The weights respectively corresponding to the first to fourth evaluation functions can be adjusted (tuned) as appropriate in accordance with a purpose of the multi-slice imaging. The processing circuitry 131, that realizes the collection order determination function 1319, determines the weights in accordance with an imaging condition. The display 127 may display the weights relating to the combined function, for example. In this case, when imaging conditions, such as a purpose of imaging and a body part targeted for imaging, etc. are input by an operator's instruction via the interface 125, the processing circuitry 131, that realizes the collection order determination function 1319, determines the weights in accordance with imaging conditions. The processing circuitry 131 may change each of the weights in accordance with an operator's input via the interface 125.

Since the advantageous effects of the fourth application example are those of the embodiment and the first to third application examples, descriptions thereof are omitted.

Modification

In the present modification, the collection order of slices in the multi-slice imaging is stored in advance in the storage 129 in association with a body part targeted for imaging. In the present modification, the static magnetic field distribution generation function 1315 and the static magnetic field shimming function 1317 shown in FIG. 1 are no longer necessary.

The storage 129 stores a collection order of slices in the multi-slice imaging in association with a body part targeted for imaging. The association of a collection order with a body part targeted for imaging is realized by a lookup table, for example. The storage 129 may store a collection order in association with patient information, such as sex, age, weight, and height, etc., in addition to a body part targeted for imaging. The storage 129 may store a collection order in association with preset data relating to imaging conditions.

Upon an input of a body part targeted for imaging of the subject P via the interface 125, the processing circuitry 131, that realizes the system control function 1311, reads the collection order from the storage 129 in accordance with the input body part. The processing circuitry 131 receives examination information from a radiology information system (RIS), etc. via a network, and then reads the collection order from the storage 129 in accordance with the body part targeted for imaging included in the examination information. The processing circuitry 131 may read a collection order from the storage 129 in accordance with the reading of the preset data relating to the multi-slice imaging.

The display 127 displays the read collection order. The display 127 may display the collection order along with the preset data or a body part targeted for imaging.

With the interface 125, an operation to change the displayed collection order is input in accordance with an operator's instruction.

The processing circuitry 131, that realizes the collection order determination function 1319, updates the read collection order to the changed collection order based on the operation to change. The processing circuitry 131 causes the storage 129 to store the updated collection order in association with a body part targeted for imaging. The processing circuitry 131 may cause the storage 129 to store the updated collection order in association with the preset data.

The imaging control circuitry 121 performs the multi-slice imaging in accordance with the read collection order. If the collection order is updated, the imaging control circuitry 121 performs multi-slice imaging in accordance with the updated collection order.

According to the above-described configuration, the following advantageous effects can be obtained.

According to the MRI apparatus 100 in the present embodiment, it is possible to store a collection order of slices in which second MR signals are collected in the multi-slice imaging for collecting MR signals (second MR signals) in each of the slices, along with radiation of a non-slice-selective prepulse, in association with a body part targeted for imaging, and to perform the multi-slice imaging in accordance with the collection order. According to the present MRI apparatus 100, it is possible to display the collection order on the display 127, to input an operation to change the displayed collection order, to update the collection order to the changed collection ordering in accordance with the change operation, and to cause the storage 129 to store the updated collection order in association with a body part targeted for imaging, and to perform multi-slice imaging in accordance with the updated collection order.

According to the MRI apparatus 100 of the present embodiment as described above, it is possible to prevent a prepulse radiated for the collection of second MR signals in a preceding stage of the multi-slice imaging from affecting second MR signals collected in a subsequent stage of the multi-slice imaging. Thus, according to the MRI apparatus 100, it is possible to improve image quality of an MR image generated in the multi-slice imaging. In addition, in the present modification, a collection order can be determined without performing static magnetic field shimming; therefore, it is possible to improve throughput regarding the determination of a collection order, and to shorten an examination time.

As another modification of the foregoing embodiment and application examples, if the technical idea of the present MRI apparatus 100 is realized by cloud computing or the like, a server on the Internet may have the storage 129 and the processing circuitry 131 shown in the schematic diagram of FIG. 1. In this case, the static magnetic field distribution generation function 1315, the static magnetic field shimming function 1317, the collection order determination function 1319, etc. are realized by installing a program (a medical processing program) that executes these functions onto the processing apparatus 131 of a server and expanding these functions in a memory.

According to the foregoing embodiment, the first to fourth application examples, and the modifications, etc., the multi-slice imaging that involves radiation of prepulse can be performed without degrading image quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
imaging control circuitry that performs shimming imaging for collecting a first magnetic resonance signal, which is used for static magnetic field shimming, in a first collection range, and multi-slice imaging for collecting a second magnetic resonance signal from each of a plurality of slices along with radiation of a non-region-selective prepulse corresponding to each of the slices in a second collection range that overlaps at least a part of the first collection range; and
processing circuitry that generates a plurality of static magnetic field distributions respectively corresponding to the slices based on the first magnetic resonance signal, determines a first center frequency of an RF pulse corresponding to each of the slices and a second center frequency of the prepulse based on the static magnetic field distribution, and determines a collection order of slices from which the second magnetic resonance signal is collected in the multi-slice imaging in accordance with at least one of the first center frequency or the second center frequency, wherein
the imaging control circuitry performs the multi-slice imaging in accordance with the collection order, the first center frequency, and the second center frequency.

2. The magnetic resonance imaging apparatus according to claim 1, wherein
the RF pulse has a first band that includes the first center frequency and excites magnetization of water in each of the slices,
the prepulse has a second band that includes the second center frequency and suppresses generation of the second magnetic resonance signal from fat tissue, and
the processing circuitry determines the collection order in such a manner that the second band of the prepulse relating to a collection slice in which the second magnetic resonance signal is collected does not overlap the first band of the RF pulse applied to a slice which is different from the collection slice, after the second magnetic resonance signal is collected in the collection slice.

3. The magnetic resonance imaging apparatus according to claim 1, wherein
the processing circuitry determines the collection order so as not to perform imaging sequentially to two adjacent slices in the second collection range.

4. The magnetic resonance imaging apparatus according to claim 1, wherein
the processing circuitry
calculates a degree of similarity between static magnetic field distributions after performing static magnetic field shimming by the imaging control circuitry, and
determines the collection order in such a manner that the degree of similarity between two slices subjected to sequential imaging in the multi-slice imaging becomes high.

5. The magnetic resonance imaging apparatus according to claim 1, wherein
the processing circuitry
determines a first current value corresponding to gradient intensity that makes a static magnetic field in each of the slices homogeneous based on the static magnetic field distribution,
determines a second current value corresponding to an offset of a gradient field relating to a direction which is orthogonal to the slices, based on the second center frequency, and
determines the collection order in such a manner that the second center frequencies relating to two slices subjected to sequential imaging in the multi-slice imaging become close, by using the offset.

6. The magnetic resonance imaging apparatus according to claim 1,
further comprising a display that displays the collection order along with the first center frequency and the second center frequency corresponding to each of the slices, wherein
the processing circuitry changes the collection order in accordance with an operator's instruction as to the displayed collection order, and
the imaging control circuitry performs the multi-slice imaging in accordance with the changed collection order, the first center frequency, and the second center frequency.

7. A magnetic resonance imaging apparatus comprising:
a memory that stores, in association with a body part targeted for imaging, a collection order of slices in which the magnetic resonance signals are collected in multi-slice imaging for collecting magnetic resonance signals from the slices along with radiation of a non-region-selective prepulse, the collection order of slices being determined by at least one of a first center frequency of an RF pulse and a second center frequency of the non-region-selective prepulse; and
imaging control circuitry that performs the multi-slice imaging in accordance with the collection order.

8. The magnetic resonance imaging apparatus according to claim 7, further comprising:
a display that displays the collection order;
an interface with which an operation to change the displayed collection order is input; and
processing circuitry that updates the collection order in accordance with the change operation and causes a memory to store the updated collection order in association with the body part targeted for imaging, wherein
the imaging control circuitry performs the multi-slice imaging in accordance with the updated collection order.

9. A multi-slice imaging method, in which
shimming imaging for collecting a first magnetic resonance signal used for static magnetic field shimming from a first collection range, and multi-slice imaging for collecting a second magnetic resonance signal from each of the slices along with radiation of a non-region-selective prepulse corresponding to each of the slices in a second collection range that overlaps at least a part of the first collection range, are performed, the method comprising:
generating a plurality of static magnetic field distributions respectively corresponding to each of the slices based on the first magnetic resonance signal;
determining a first center frequency of an RF pulse corresponding to each of the slices based on the static magnetic field distribution;
determining a second center frequency of the prepulse based on the static magnetic field distribution;
determining a collection order of slices in which the second magnetic resonance signal is collected in the multi-slice imaging, in accordance with at least one of the first center frequency and the second center frequency; and
performing the multi-slice imaging in accordance with the collection order, the first center frequency, and the second center frequency.

10. The method according to claim 9,
wherein the RF pulse has a first band that includes the first center frequency and excites magnetization of water in each of the slices,
wherein the prepulse has a second band that includes the second center frequency and suppresses generation of the second magnetic resonance signal from fat tissue, and
further comprising preventing the second band of the prepulse relating to a collection slice in which the second magnetic resonance signal is collected from overlapping the first band of the RF pulse applied to a slice which is different from the collection slice, after the second magnetic resonance signal is collected in the collection slice.

11. The method according to claim 9, wherein determining the collection order determines the collection order so as not to perform imaging sequentially to two adjacent slices in the second collection range.

12. The method according to claim 9, further comprising:
calculating a degree of similarity between static magnetic field distributions after performing static magnetic field shimming by the imaging control circuitry, and
determining the collection order in such a manner that the degree of similarity between two slices subjected to sequential imaging in the multi-slice imaging becomes high.

13. The method according to claim 9, further comprising:
determining a first current value corresponding to gradient intensity that makes a static magnetic field in each of the slices homogeneous based on the static magnetic field distribution,
determining a second current value corresponding to an offset of a gradient field relating to a direction which is orthogonal to the slices, based on the second center frequency, and
determining the collection order in such a manner that the second center frequencies relating to two slices subjected to sequential imaging in the multi-slice imaging become close, by using the offset.

14. The method according to claim 9, further comprising:
displaying on a display the collection order along with the first center frequency and the second center frequency corresponding to each of the slices,
changing the collection order in accordance with an operator's instruction as to the displayed collection order, and
performing the multi-slice imaging in accordance with the changed collection order, the first center frequency, and the second center frequency.

* * * * *